United States Patent [19]

Jewell

[11] 4,104,541
[45] Aug. 1, 1978

[54] AUTOMATIC ELECTRIC POWER SWITCH
[76] Inventor: William R. Jewell, 8600 Nan Lee Dr., Springfield, Va. 22152
[21] Appl. No.: 779,010
[22] Filed: Mar. 18, 1977
[51] Int. Cl.² .............................................. H01H 7/00
[52] U.S. Cl. ............................... 307/141; 340/309.1; 58/33; 315/360
[58] Field of Search .................. 307/141, 141.4, 141.8, 307/293; 340/309.1, 309.4; 58/33; 315/360

[56] References Cited
U.S. PATENT DOCUMENTS

| | | | |
|---|---|---|---|
| 3,005,919 | 10/1961 | Dias | 307/141.4 |
| 3,101,418 | 8/1963 | Gould | 307/141 |
| 3,714,457 | 1/1973 | Sweeney | 307/141 |
| 3,728,500 | 4/1973 | Ingram | 200/38 FB |
| 3,889,132 | 10/1975 | Vreeland | 307/141 |
| 3,925,629 | 12/1975 | Albinger | 200/38 R |
| 3,940,660 | 2/1976 | Edwards | 315/360 |
| 3,949,240 | 4/1976 | Saito | 307/141 |
| 3,949,241 | 4/1976 | Maute | 307/141 |
| 3,964,677 | 6/1976 | Schalow | 165/12 |
| 3,985,982 | 12/1976 | Schneidinger | 200/33 R |

Primary Examiner—Robert K. Schaefer
Assistant Examiner—Morris Ginsburg
Attorney, Agent, or Firm—Lane, Aitken, Dunner & Ziems

[57] ABSTRACT

An automatic integrated circuit time delay switch for use as a switch in circuit with an external electrical device and an external electrical source. The switch operates on a programmed 24-hour time cycle that is defined by the initial application of power to the switch and a switch delay time that can either be preset at the factory or independently selected by the user. The application of power automatically sets the time delay switch in an initial state and starts the timing of the switch cycle. After a specified delay time, the switch automatically changes state and remains in this state until 24 hours after the initial application of power to the invention, at which time the switch is returned to its initial state. This sequence of events is repeated on a 24 hour cycle until power to the switch is cut off.

12 Claims, 5 Drawing Figures

AUTOMATIC ELECTRIC POWER SWITCH

BACKGROUND OF THE INVENTION

The invention relates to an automatic time delay switch and, more particularly, to such a switch including means to switch power on a programmed 24 hour switch timing cycle from an external electrical source to at least one external electrical device.

Time delay switches are used to make or break a circuit by means of a switch which is controlled by either solid state or mechanical timing control means. The timing control means opens or closes the switch in accordance with a preset switching program that is repeated, usually on a 24 hour cycle.

Present commercially available time delay switches tend to be relatively large box-like devices with switch timing delay controls that allow the user to select a switch cycle program. Such time delay switches are often used to automatically turn on lamps or other "plug in" household electrical devices for specified periods of time when the homeowner is absent from the premises.

Accordingly, it is an object of the invention to provide a simple and convenient means to automatically switch power to external electrical devices on a 24 hour time cycle.

A further object of this invention is to provide a means whereby the switching is performed under the control of a small, efficient, and lower power solid state timing control means.

Another object of the invention is to provide a small, compact, switching device that has a minimum of external timing controls.

A further object of the invention is to provide a compact switching device that will automatically begin a switch timing cycle when power is initially applied to the device.

Another object of the invention is to provide embodiments of a time delay switching device that can receive power from a wall plug outlet, a wall switch outlet, or a lamp socket, and can distribute switched power to either a wall switch circuit or external devices that are plugged into connectors or screwed into a lamp socket attached to the device.

These and other objects of this invention will become apparent from a review of the detailed specification which follows and a consideration of the accompanying drawings.

BRIEF SUMMARY OF THE INVENTION

In order to achieve the objects of the invention and to overcome the problems of the prior art, the automatic time delay switch, according to the present invention, includes means for switching power on a programmed 24 hour switch timing cycle from an external electrical source to at least one external electrical device. The various embodiments of the invention are adapted to receive power from a wall plug outlet, a lamp socket, or a wall switch outlet and to switch power to external devices that are in circuit with the wall switch outlet or engaged with connectors or sockets connected to the time delay switch output of the apparatus of the invention.

An external power source supplies power to the apparatus and, under the switching control of the timing control circuitry, supplies power to an external device. When power is first applied to the apparatus, the integrated circuit timing control circuitry is initialized, the time delay switch controlling the flow of current to the external device is closed, the external device is energized, and the 24 hour timing cycle begins.

After a specified delay time that could either be preset at the factory or selected by the user, the time delay switch is opened and the external device is de-energized. The time delay switch is closed again and the external device is re-energized approximately 24 hours after the initial application of power to the invention. This switching activity is then repeated on a 24 hour cycle.

It should be readily apparent that the states of the time delay switch in the above description can be reversed so that the switch would initially be open and would then be closed after a specified delay time. In addition, since the cycle time of the invention is not limited to 24 hours the time delay switch can operate in the manner described above for cycle times that are greater than or less than 24 hours. It should also be noted that the delayed switching operation of the invention can be inhibited by providing a timer inhibit switch to selectively deactivate the timing control logic of the invention.

DETAILED DESCRIPTION OF PREFERRED EMBODIMENTS

Figure 2:
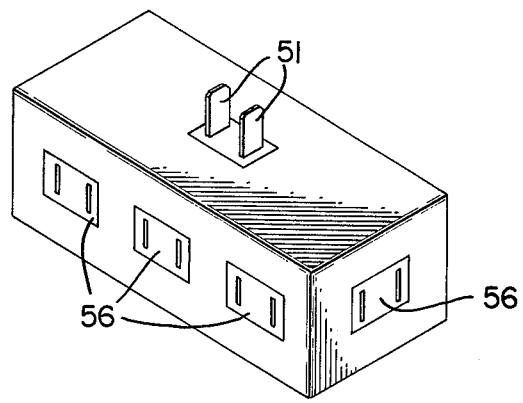
FIG. 2 illustrates an embodiment of the invention in which power is supplied by means of a wall plug and switched power is distributed through a plurality of female plug connectors.
Figure 3:
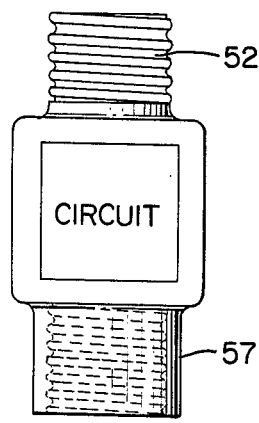
FIG. 3 illustrates an embodiment of the invention in which power is supplied by means of a wall socket connector and switched power is distributed by means of a female power socket.
Figure 4:
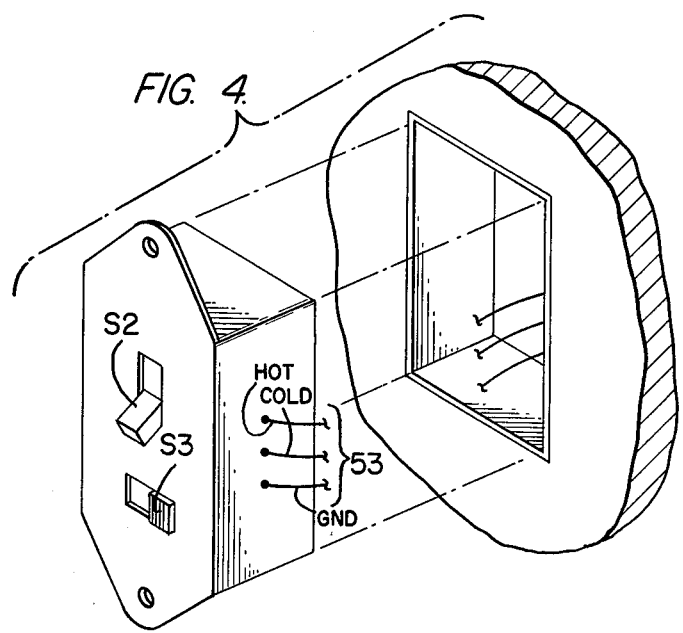
FIG. 4 illustrates an embodiment of the invention adapted to connect with a wall switch outlet and distribute either time delay switched power or manual switch controlled power to the devices in the wall switch circuit.

Physical embodiments of the present invention are illustrated in FIGS. 2, 3 and 4. The embodiments illustrate various ways in which the input power can be supplied to the apparatus of the invention and the switched output power can be distributed to external electrical devices. In the following discussion the reference numerals that are cited each uniquely define a specific component of the invention. If a specific component is illustrated in more than one figure, it will be identified by the same numerical designation in each of the figures in which it appears.

FIG. 2 illustrates an embodiment wherein power is supplied by means of a plug 51 that is adapted to be inserted into a standard wall outlet. The embodiment of FIG. 3 shows a male socket connector 52 that can be adapted to screw into a lamp socket, thereby supplying power to the apparatus of the invention when a switch in circuit with the lamp socket is closed. FIG. 4 illustrates an embodiment that can be connected to a standard wall switch outlet by means of wires 53. Power is applied to the apparatus of the invention when the switch S2 is turned on.

The embodiments of FIGS. 2, 3 and 4 also illustrate various ways in which the automatic time delay switched power can be applied to external electrical devices. FIG. 2 shows a number of female plug sockets 56 that are adapted to be mounted on or embedded in any face of the apparatus of the invention. These female sockets can receive the male socket plugs of various external electrical devices. FIG. 3 illustrates a female socket, for instance a standard lamp socket, that is mounted or embedded in the apparatus of the invention and that is adapted to supply automatically switched power directly to an electrical device such as a lamp bulb. FIG. 4 illustrates a wall switch embodiment that supplies automatically switched power, by means of the "hot" and "cold" wires of a wall switch outlet to the external circuit that is operatively associated with the wires.

In all of the above embodiments it is understood that timing for the automatic 24 hour switching cycle of the invention is initiated when power is initially applied to the apparatus of the invention. In the embodiment of FIG. 2 power is applied and timing begins when the plug 51 is inserted into a wall socket. The timing cycle begins in FIG. 3 when the male connector 52 is engaged with its associated female power socket and the switch in circuit with the power socket is turned on. The wall switch embodiment of FIG. 4 applies power and begins the timing cycle when the switch S2 is closed.

Additionally, a timer inhibit switch S3 can be included in order to disable the timing logic of the invention and thereby enable the switch S2 to manually control the switching of power.

Figure 1:
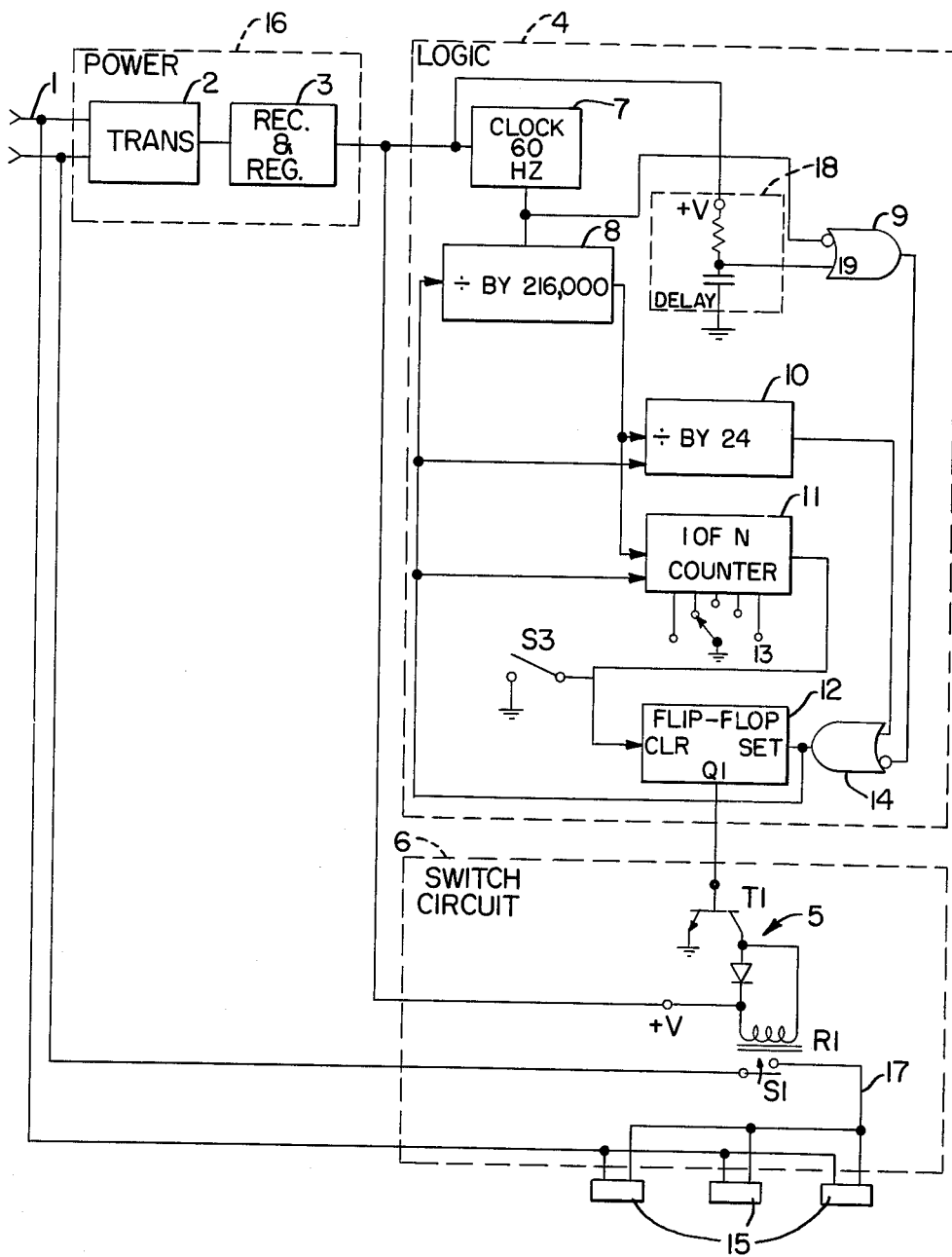
FIG. 1 shows a preferred embodiment of the power, logic, and switch circuitry of the invention for all embodiments receiving power from a wall plug outlet or a lamp socket and distributing power to external devices engaged with female connectors attached to the apparatus of the invention.

FIG. 1 illustrates the electrical circuit that is associated with the embodiments of FIGS. 2 and 3. As shown in FIG. 1, 110 v AC power is converted to an appropriate DC voltage by the operation of a power circuit 16 comprising a transformer 2 and a rectifier and voltage regulator 3 that are operated in a manner that is known to those skilled in the electrical art.

The DC voltage generated by the power circuit 16 supplies power to a logic circuit 4 and to a relay activation circuit 5 of the switch circuit 6.

The logic circuit 4 includes integrated circuit components and discrete electrical components that interact to perform the automatic initialization and timing functions of the invention. A 60 HZ clock circuit 7 of the logic circuit 4 generates a continuous stream of electrical pulses at a fixed 60 HZ frequency by means that are known to those skilled in the electrical art. The clock pulses are applied to a divider 8 and a circuit initialization gate 9 of the logic circuit 4.

When power is initially applied the RC delay circuit 18 provides an input signal at pin 19 of gate 9 that is a logic low when power is first applied and that remains a low until just after all of the integrated circuits of the logic circuit 4 have been powered up and the 60 HZ clock 7 has begun operating. The momentary low at the pin 19 of the gate 9 enables at least one clock pulse to be passed by the gate 9, thereby initializing the logic circuit 4. The initialization pulse clears the divider 8 and a divider 10, clears a 1 of N counter 11, and sets a switch control flipflop 12 so that the output Q1 is high. At the same time, the voltage signal at pin 19 continues to rise due to the charging of the capacitor in circuit 18. After the logic circuit is initialized, the rise in the signal at pin 19 is sufficient to make it a logic high, thus disabling the gate 9 and blocking the further generation of initialization pulses. It will be readily apparent to those skilled in the art that other means could be used to provide an initialization pulse that is generated by application of power to the logic circuit, the choice of means being dictated by the physical design parameters of the apparatus.

Following initialization, the divider 8 receives the 60 HZ clock pulses 7 and generates a single output pulse for each 216,000 input clock pulses that are received. Thus the divider 8 generates a single output pulse for each hour that passes after the initial application of power to the invention.

The one pulse per hour output of the divider 8 is applied to the input of the 1 of N counter 11 and the input of the divider 10. The 1 of N counter 11 generates a single output pulse where N is defined by the configuration of a counter input data switch 13. The data switch 13 defines the switch time delay of the apparatus and could be adapted to be preset at the factory or, alternately, adjusted by the user. The output of the counter 11 is applied to the clear input of the control flip-flop 12 and, thus, clears the flipflop 12 when the counter 11 generates an output pulse. Clearing the flipflop 12 results in a low at its output Q1.

The divider 10 generates one output pulse after receiving 24 input pulses from the divider 8. Thus, the divider 10 generates a single output pulse 24 hours after power is initially applied to the invention and every 24 hours thereafter. The 24 hour cycle pulse of the divider 10 is passed to the set input of the switch control flipflop 12 by the gate 14. Thus, the flipflop 12 is set whenever the divider 10 generates an output pulse, thereby forcing Q1 to a logical high. It should be noted that the divider 10 could be replaced by a divider that would generate an output pulse after a number X of input pulses. Thus, the cycle time of the circuit could be changed from 24 hours to X hours.

From the above description, it should be apparent that when power is initially applied to the invention, the logic circuitry is initialized and the control flipflop 12 is set to produce a high signal at pin Q1. Thereafter, counter 11 counts the "hour pulses" generated by the divider 8 until a specified "switch toggle" count is reached, thus generating the counter 11 output pulses and thereby causing the switch control flipflop 12 to clear and pin Q1 to go low. The switch control flipflop 12 remains in its cleared state until the pulse output of the divider 10 sets it again, 24 hours after power was initially applied. The output of divider 10 also clears the dividers 8 and 10 and the counter 11. Thus, the switching sequence is repeated every 24 hours. It should be noted that the flipflop 12 response can be reversed by reversing its set and clear inputs.

FIG. 1 shows the time delay switch circuit 6 of the invention. As can be seen, the output of the switch control flipflop 12 at Q1 controls the state of a transistor T1. When the signal on pin Q1 is high the transistor T1 conducts and relay R1 is energized. When the signal on pin Q1 is low the transistor T1 is turned "off" and the relay R1 is de-energized.

Thus, the state of the control flipflop 12 controls the state of the relay R1 and, consequently, the relay-controlled position of the switch S1. The switch S1 in turn determines whether or not current is flowing in the "external electrical device" circuit 17.

The external electrical device connectors 15 are in circuit with the switch S1 and the external AC source 1. The connectors correspond to the female plugs 56 of FIG. 2 and the female socket 57 of FIG. 3. Thus, when S1 is closed by the energized relay R1, power is applied to the external device connectors 15.

Figure 5:
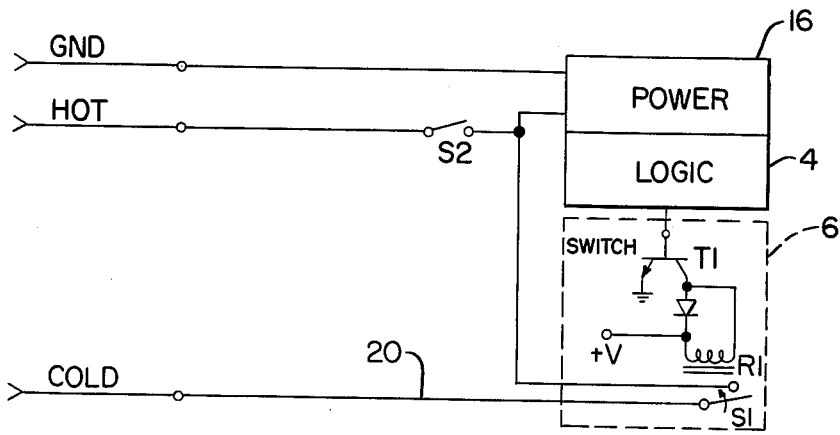
FIG. 5 shows a preferred embodiment of the power, logic, and switch circuitry of the invention for embodiments adapted to connect with a wall switch outlet.

The circuit of FIG. 5 is associated with the embodiment illustrated in FIG. 4. The power, logic, and switch circuitry of FIG. 5 are the same as specified in FIG. 1. However, the connections associated with the power input and switching functions of the invention are different since the input power connections and output circuit connections are different when the invention is connected to a wall switch outlet.

As shown in FIG. 5, the energized or "hot" wire of the switch outlet and the ground for the external power circuit are connected in circuit with the switch S2 to the 110 v AC power input circuit 16 of the invention. Thus, power is applied to the invention when the wall switch S2 is closed. As explained previously, the application of power initializes the logic circuitry 4, causes the transistor T1 to conduct, and thereby energizes the relay R1 and closes the switch S1.

The closure of the switch S1 causes current to flow in the external device circuit 20 and power to be applied to the external electrical devices in the circuit. The switch S1 remains closed and power flows in the external device circuit 20 until the logic circuit 4 de-energizes the relay R1 and opens the switch S1 after the specified delay time. Thereafter the switch S1 remains open until the 24 hour cycle, as measured from the switch S2 activation time, is complete and the relay R1 is again energized by the logic circuit 4. The energized relay R1 then closes the switch S1.

As explained previously, the logic timing function of the invention could be inhibited by activation of a timer inhibit switch S3, as shown in FIG. 4 and FIG. 1. Thus, if the switch S2 of FIG. 5 is closed and the counter 11 output of FIG. 1 is forced low by the closure of the switch S3, the logic control circuitry will not be able to de-energize the relay R1 and the switch S1 will remain closed. Therefore, the external device circuit 20 of FIG. 5 will remain activated until the wall switch S2 is opened.

The invention may be embodied in other specific forms without departing from its spirit or essential characteristics. The present embodiments are, therefore, to be considered in all respects as illustrative and not restrictive, the scope of the invention being indicated by the claims rather than by the foregoing description, and all changes which come within the meaning and range of the equivalents of the claims are therefore intended to be embraced therein.

What is claimed is:

1. An automatic programmed time delay switching device for use as a time delayed switch in circuit with at least one external electrical device and an external electrical source, wherein the power to the external electrical device is switched in a specified time cycle, said cycle including a first automatic switch setting when power is initially applied to the switching device and when said cycle is completed and a second automatic switch setting at a specified time delay after said first switch setting, said switching device comprising a power input means structurally adapted to receive power from said external electrical source and to conduct the power to the electrical circuitry of the switching device, switch timing means in circuit with said source and said power input means for measuring said specified time delay after power is applied to the switching device and generating a switch control signal, timing circuit initialization means in circuit with said switch timing means for initializing said timing means when power is first applied to said switching device, switching means in circuit with said external source and said timing means for switching on or off the power to said external electrical device in response to said switch control signal, and power output means in circuit with said switching means structurally adapted to distribute power to said external electrical device.

2. The device as set forth in claim 1, wherein said power input means includes a plug adapted to engage with the socket of an electrical wall outlet, said plug when engaged causing power to be transferred from the wall socket to the switching device.

3. The device as set forth in claim 1, wherein said power input means includes a socket connector adapted to engage with an electrical socket, thereby causing power to be transferred from the socket to the switching device.

4. The device as set forth in claim 1, wherein said power input means includes an electrical wall switch in circuit with the hot conductor and ground conductor of a switch outlet, thereby causing power to be transferred to the switching device when the wall switch is switched to its conducting position.

5. The device as set forth in claim 4, wherein said switching device includes an additional control means for selectively inhibiting the time delay operation of said switching means so that when the switching means is inhibited the electrical wall switch will independently control the distribution of power to said external electrical device.

6. The device as set forth in claim 4, wherein said power output means includes electrical conductors operatively connecting the hot and cold conductors of said switch outlet in circuit with said switching means.

7. The device as set forth in claim 1, wherein said switch timing means includes integrated circuit logic components.

8. The device as set forth in claim 7, wherein said switch timing means is adapted to be automatically initialized by said timing circuit initialization means when power is initially applied to said device.

9. The device as set forth in claim 1, wherein said power output means includes at least one plug connector located on or embedded in at least one face of said switching device, said plug connector being in circuit with said switching means of the device and adapted to operatively engage with a corresponding connector of said external electrical device.

10. The device as set forth in claim 1, wherein said power output means includes at least one electrical socket located in or embedded in at least one face of said switching device, said socket being in circuit with said switching means of the device and adapted to receive a socket connector of said external electrical device.

11. The device as set forth in claim 1, wherein said specified time delay is set by a time delay control means that is adapted to preset the time delay to a fixed value that cannot be changed by the user.

12. The device as set forth in claim 1, wherein said specified time delay is set by a time delay control means that is adapted to allow a user to vary the value of time delay.

* * * * *